United States Patent
Vashchenko et al.

(10) Patent No.: US 6,919,588 B1
(45) Date of Patent: Jul. 19, 2005

(54) HIGH-VOLTAGE SILICON CONTROLLED RECTIFIER STRUCTURE WITH IMPROVED PUNCH THROUGH RESISTANCE

(75) Inventors: Vladislav Vashchenko, Palo Alto, CA (US); Andy Strachan, Santa Clara, CA (US); Peter J. Hopper, San Jose, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/650,000

(22) Filed: Aug. 27, 2003

(51) Int. Cl.[7] .............................................. H01L 29/74
(52) U.S. Cl. ........................ 257/107; 257/133; 257/360; 257/362; 257/363
(58) Field of Search ................................ 257/133, 360, 257/362, 363

(56) References Cited

U.S. PATENT DOCUMENTS

| | | | |
|---|---|---|---|
| 3,502,951 A | 3/1970 | Hunts | 317/235 |
| 4,774,420 A | 9/1988 | Sutton | 307/270 |
| 4,937,647 A | 6/1990 | Sutton | 357/43 |
| 4,987,465 A * | 1/1991 | Longcor et al. | 257/357 |
| 5,156,989 A | 10/1992 | Williams et al. | 437/41 |
| 5,485,027 A | 1/1996 | Williams et al. | 257/343 |
| 5,959,332 A * | 9/1999 | Ravanelli et al. | 257/360 |
| 6,750,489 B1 | 6/2004 | Merrill | 257/292 |

OTHER PUBLICATIONS

Julian Z. Chen, Ajith Amerasekera and Tom Vrotsos, "Bipolar SCR ESD Protection Circuit for High Speed Submicron Bipolar/BiCMOS Circuits", IEDM, pp. 337–340, (14.1.1–14.1.4), 1995, IEEE.

* cited by examiner

Primary Examiner—David Nelms
Assistant Examiner—Mai-Huong Tran
(74) Attorney, Agent, or Firm—Mark C. Pickering

(57) ABSTRACT

When a high-voltage, such as from an ESD pulse, is placed across a silicon controlled rectifier, which includes an NPN transistor and a PNP transistor that is connected to the NPN transistor, the likelihood of punch through occurring between two regions of the rectifier is substantially reduced by forming the emitter of one transistor adjacent to the tails of the sinker down region of the other transistor.

20 Claims, 8 Drawing Sheets

HIGH-VOLTAGE SILICON CONTROLLED RECTIFIER STRUCTURE WITH IMPROVED PUNCH THROUGH RESISTANCE

RELATED APPLICATION

The present application and U.S. application Ser. No. 10/649,989, entitled "Silicon Controlled Rectifier Structure with Improved Punch Through Resistance," by Vladislav Vashchenko et al., which is filed on an even date herewith, have related subject matter.

DETAILED DESCRIPTION OF THE INVENTION

Figure 1:
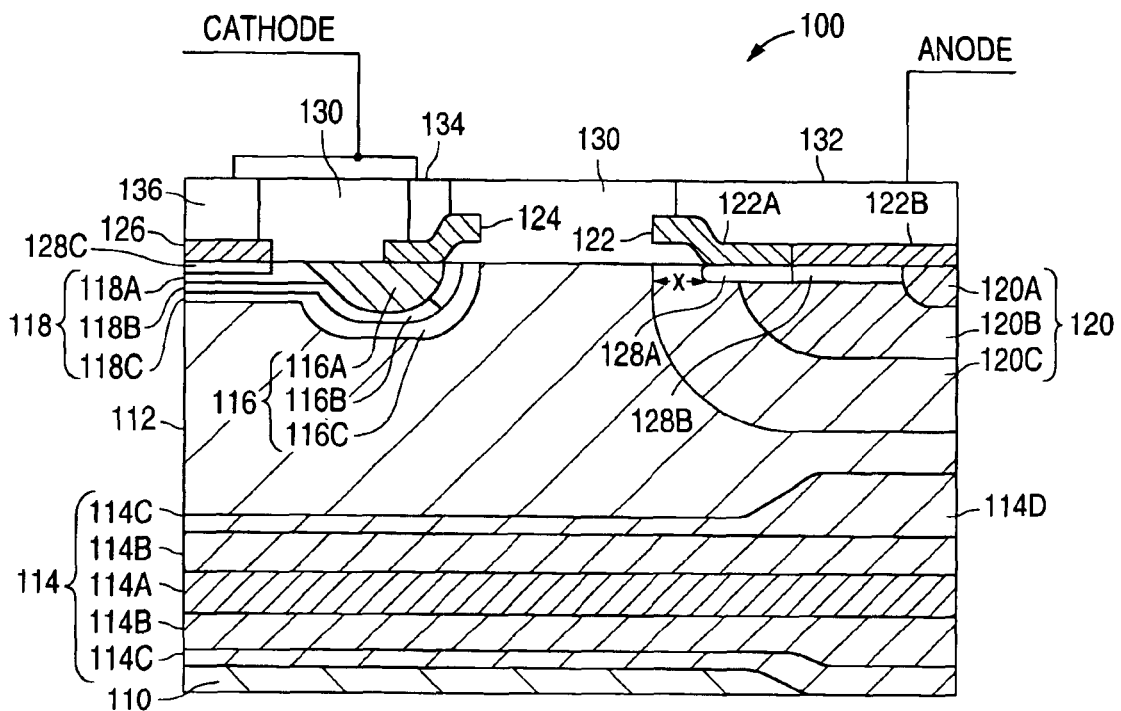
FIG. 1 is a cross-sectional view illustrating an example of a silicon controlled rectifier (SCR) structure 100 in accordance with the present invention.

FIG. 1 shows a cross-sectional view that illustrates an example of a silicon controlled rectifier (SCR) structure 100 in accordance with the present invention. As described in greater detail below, SCR structure 100, which can be used to provide electro-static discharge (ESD) protection, reduces the likelihood of punch-through between two regions by forming a sinker down region between the two regions.

As shown in FIG. 1, SCR structure 100 includes a p-type substrate 110 and an n-type epitaxial layer 112 that is formed on substrate 110. SCR structure 100 is a high-voltage device which, when compared to a conventional low-voltage bipolar device, has a substantially thicker epitaxial layer. For example, epitaxial layer 112 can be approximately 15–17 um thick.

In addition, SCR structure 100 can include an n-type buried layer 114 that is formed in the top surface of substrate 110. As shown in FIG. 1, buried layer 114 includes a center region 114A, a first outer region 114B that adjoins center region 114A, and a second outer region 114C that adjoins first outer region 114B. In addition, second outer region 114C has a sinker up region 114D that extends towards the top surface of epitaxial layer 112.

Center region 114A has a first dopant concentration of, for example, $1\times10^{20}$ (n+), while first outer region 114B has a second dopant concentration of, for example, $1\times10^{19}$. Second outer region 114C has a third dopant concentration of, for example, $1\times10^{18}$, while epitaxial layer 112 has a fourth dopant concentration of, for example, $1\times10^{15}$. The first and second outer regions 114B and 114C represent the diffusion tails of center region 114A.

Further, SCR structure 100 includes a p-type region 116 that is formed in the top surface of epitaxial layer 112. P-type region 116 has a center region 116A, a first outer region 116B that adjoins center region 116A, and a second outer region 116C that adjoins first outer region 116B.

Center region 116A has a fifth dopant concentration of, for example $1\times10^{20}$ (p+), while first outer region 116B has a sixth dopant concentration of, for example, $1\times10^{19}$. Second outer region 116C has a seventh dopant concentration of, for example, $1\times10^{18}$, while substrate 110 has an eighth dopant concentration of, for example, $1\times10^{15}$. The first and second outer regions 116B and 116C represent the diffusion tails of center region 116A.

SCR structure 100 additionally includes a p-type region 118 that is formed in the top surface of epitaxial layer 112. P-type region 118 has a center region 118A, a first outer region 118B that adjoins center region 118A, and a second outer region 118C that adjoins first outer region 118B.

Center region 118A has the fifth dopant concentration, while first outer region 118B has the sixth dopant concentration and second outer region 118C has the seventh dopant concentration. The first and second outer regions 118B and 118C represent the diffusion tails of center region 118A. P-type region 118 is shallower than p-type region 116.

SCR structure 100 further includes an n-type sinker down region 120 that is formed in the top surface of epitaxial layer 112. Sinker down region 120, which is spaced apart from p-type region 116 and formed over sinker up region 114D, includes a center region 120A, a first outer region 120B that adjoins center region 120A, and a second outer region 120C that adjoins first outer region 120B. Center region 120A has the first dopant concentration, while first outer region 120B has the second dopant concentration, and second outer region 120C has the third dopant concentration. Outer regions 120B and 120C represent the diffusion tails of center region 120A.

As further shown in FIG. 1, SCR structure 100 includes a polysilicon region 122 that is formed on epitaxial layer 112 over sinker down region 120. Polysilicon region 122 includes a p+ region 122A that is formed over the first and second outer regions 120B and 120C, and an n+ region 122B that is formed over center region 120A.

SCR structure 100 also includes a p+ polysilicon region 124 that is formed on epitaxial layer 112 over p-type region 116A. SCR structure 100 further includes an n+ polysilicon region 126 that is formed on epitaxial layer 112 over p-type region 118. Polysilicon regions 122, 124, and 126 are spaced apart from each other (and can include a very thin oxide layer that contacts the epi layer which is unavoidably introduced by some fabrication processes).

In addition, SCR structure 100 includes a p+ region 128A and an n+ region 128B that are formed in the top surface of sinker down region 120, and an n+ region 128C that is formed in the top surface of region 118. Regions 128A and 1288 can be formed when dopants from regions 122A and 122B, respectively, diffuse out into sinker down region 120, and region 128C can be formed when dopants from region 126 diffuse out into region 118.

SCR structure 100 additionally includes a layer of isolation material 130 that is formed over epitaxial layer 112, and a first contact structure 132 that is formed through isolation layer 130 to make an electrical connection with polysilicon region 122. First contact structure 132, polysilicon region 122, n-type sinker down region 120, and n-type epitaxial layer 112 can function as the anode of an ESD diode structure (where the anode is connected to a to-be-protected pad).

Further, SCR structure 100 includes a second contact structure 134 that is formed through isolation layer 130 to make an electrical connection with polysilicon region 124, and a third contact structure 136 that is formed through isolation layer 130 to make an electrical connection with polysilicon region 126. Second contact structure 134 and third contact structure 136 can be electrically connected together to function, along with polysilicon regions 124 and 126 and p-type regions 116 and 118 as the cathode of the ESD diode structure (where the cathode is connected to ground).

SCR structure 100 forms a NPN bipolar transistor that utilizes n+ polysilicon region 126 and n+ region 128C as the emitter, p-type regions 116 and 118 as the base, and epitaxial layer 112, buried layer 114, sinker down region 120, and n+ region 128B as the collector. SCR structure 100 also forms a PNP transistor that utilizes p+ region 122A of polysilicon region 122 and p+ region 128A as the emitter, epitaxial layer 112, buried layer 114, and sinker down region 120 as the base, and p-type regions 116 and 118 as the collector.

In operation, when a voltage on the anode of SCR structure 100 rises with respect to the voltage on the cathode, the voltage on n-type sinker down region 120 and epitaxial layer 112 rises with respect to the voltage on p-type regions 116 and 118, thereby reverse biasing the pn junction between p-type regions 116 and 118 and n-type epitaxial layer 112. As a result, SCR structure 100 blocks a current, other than a leakage current, from flowing from the anode to the cathode until the anode-to-cathode voltage exceeds a breakdown voltage.

When the rising voltage on the anode exceeds the breakdown voltage, avalanche multiplication causes large numbers of holes to be injected into p-type regions 116 and 118 and large numbers of electrons to be injected into n-type epitaxial layer 112. The large number of holes injected into p-type regions 116 and 118 forward biases the pn junction between p-type regions 116 and 118 and n+ polysilicion region 126 due to the resistance associated with n+ polysilicon region 126. When forward biased, n+ polysilicon region 126 injects electrons into p-type regions 116 and 118.

In additions the large number of electrons injected into epitaxial layer 112 flow to sinker down region 120 where the diffusion tails 120B and 120C of sinker down region 120 provide a voltage drop at the pn junction between p+ region 128A and n-type sinker down regions 120B and 120C. The voltage drop forward biases the pn junction, thereby allowing p+ region 128A to inject holes into the tails of sinker down regions 120B and 120C.

Further, the accumulation of positive charge in p-type regions 116 and 118 and the accumulation of negative charge in epitaxial layer 112 due to the injection of large numbers of holes and electrons, respectively, reduces the magnitude of the reversed biased junction until the pn junction between p-type regions 116 and 118 and n-type epitaxial layer 112 switches and becomes forward biased. Once the pn junction between p-type regions 116 and 118 and n-type epitaxial layer 112 becomes forward biased, a large current flows from the anode to the cathode, while the anode-to-cathode voltage drops to a holding voltage that is substantially lower than the breakdown voltage.

Figure 2:
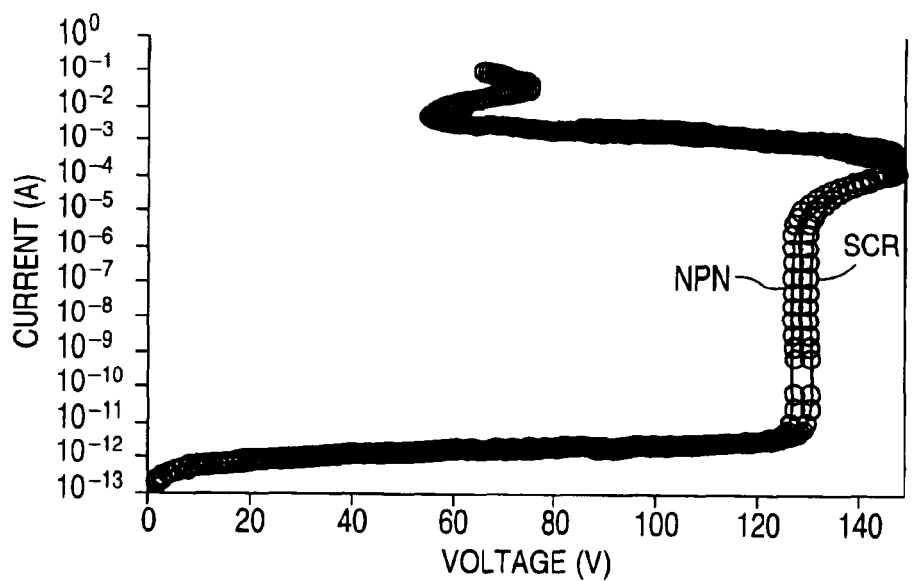
FIG. 2 is a graph illustrating a comparison between the operation of SCR structure 100 and a reference NPN transistor in accordance with the present invention.

FIG. 2 shows a graph that illustrates a comparison between the operation of SCR structure 100 and a reference NPN transistor in accordance with the present invention. The reference NPN transistor is similar to SCR structure 100, except that polysilicon region 122 is free of p-type region 122A and sinker down region 120 is free of p+ region 128A.

As shown in FIG. 2, SCR structure 100 and the NPN transistor both block substantially all of the current until the voltage rises to a breakdown voltage of approximately 125V for the NPN transistor, and a breakdown voltage of approximately 130V for SCR structure 100. Once the breakdown voltages have been exceeded, SCR structure 100 and the reference NPN transistor turn on and conduct a large current. Thus, with the exception of a slightly higher breakdown voltage, SCR structure 100 operates substantially the same as the reference NPN transistor.

One of the advantages of the present invention is that since the tails of sinker down region 120 lie between p+ region 128A and p-type region 116, the present invention substantially reduces the likelihood that p+ region 128A will punch through to p-type region 116 under high-voltage conditions.

When a high-voltage SCR structure includes two highly doped regions that are formed in a lightly-doped material of the opposite conductivity type, punch through can occur at voltages that are substantially lower than the breakdown voltage such as, for example, 40V versus 125V. By increasing the opposite dopant concentration between p+ region 128A and p-type region 116 via the tails of sinker down region 120, a voltage which is larger than the breakdown voltage is required to initiate punch through.

Another advantage is that the present invention provides control over dV/dt triggering. When the voltage on the anode increases gradually, the depletion region of the pn junction between p-type regions 116 and 118 and n-type epitaxial layer 112 also increases gradually. The change in the size of the depletion region removes electrons from epitaxial layer 112 and holes from p-type regions 116 and 118. The gradual increase, however, does not cause large number of charge carriers to move at one time.

On the other hand, when the voltage on the anode changes quickly, the depletion region also changes quickly. The quick change in the size of the depletion region can cause a large number of electrons to flow to the junction between p+ region 128A and sinker down region 120, and a large number of holes to flow to the junction between p-type regions 116 and 118 and n+ polysilicon region 126. Although this is a transitory condition, the flow of electrons and holes can trigger a SCR structure to turn on.

In the present invention, dV/dt triggering can be controlled by varying a distance X separating p+ region 128A and epitaxial layer 112. Thus, dV/dt triggering occurs at one voltage when the distance is relatively small, and at another voltage when the distance is relatively large.

Figure 3:
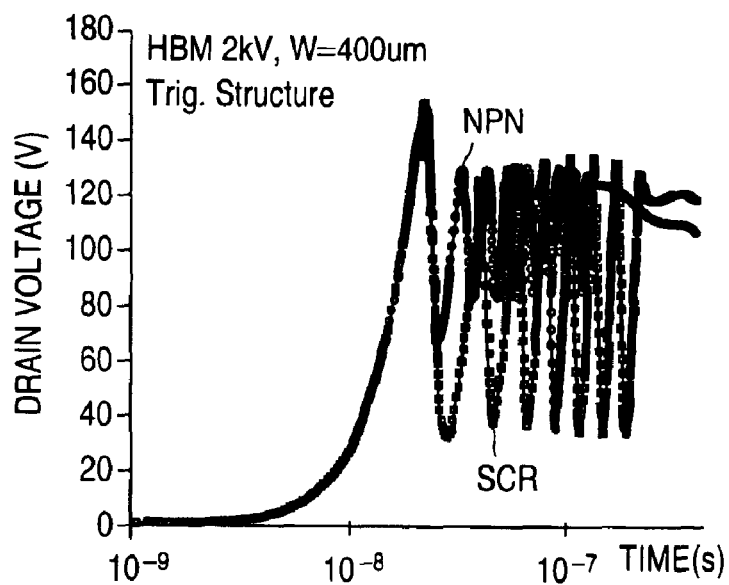
FIG. 3 is a graph further illustrating a comparison between the operation of SCR structure 100 and the reference NPN transistor in accordance with the present invention.

FIG. 3 shows a graph that further illustrates a comparison between the operation of SCR structure 100 and the reference NPN transistor in accordance with the present invention. As shown in FIG. 3, where the drain voltage is shown over time following an ESD event, SCR structure 100 has a drain voltage that is similar to the drain voltage of the reference NPN transistor following the onset of the ESD event.

Figure 4:
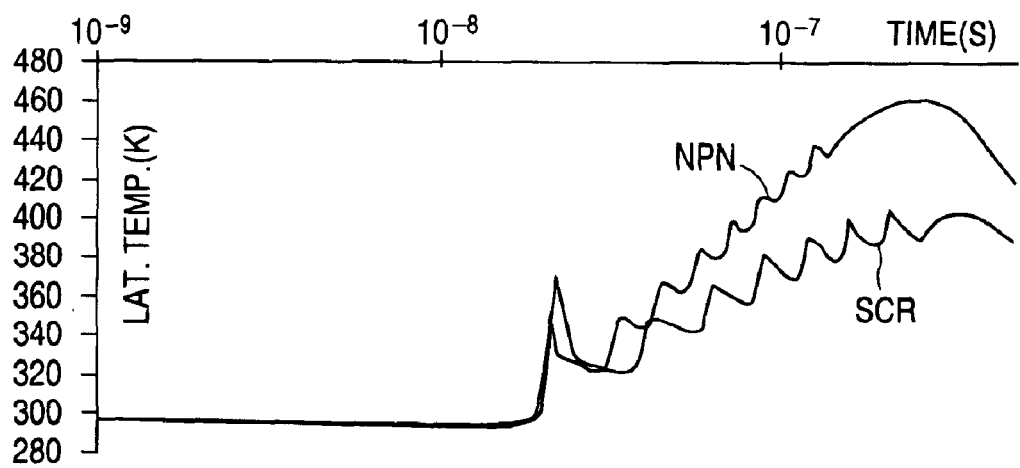
FIG. 4 is a graph additionally illustrating a comparison between the operation of SCR structure 100 and the reference NPN transistor in accordance with the present invention.

FIG. 4 shows a graph that additionally illustrates a comparison between the operation of SCR structure 100 and the reference NPN transistor in accordance with the present invention. As shown in FIG. 4, where the lattice temperature is shown over time following an ESD event (lattice temperature can be used as a figure of merit for comparative analysis), SCR structure 100 has a lower lattice temperature following the onset of the ESD event.

Figure 5:
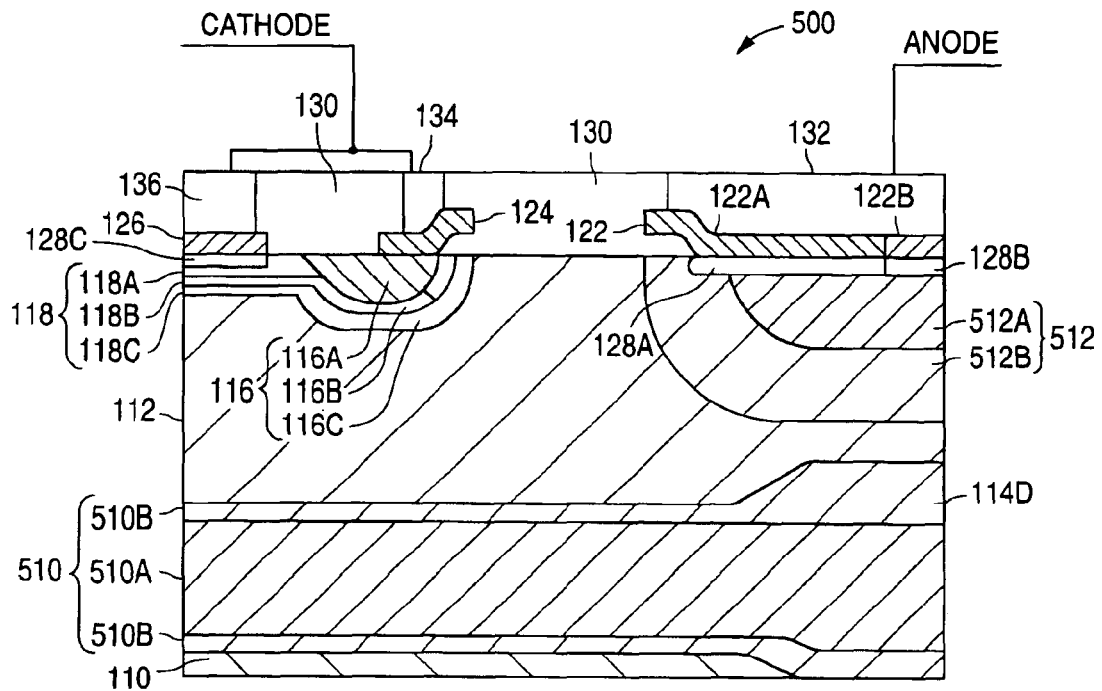
FIG. 5 is a cross-sectional view illustrating an example of a silicon controlled rectifier (SCR) structure 500 in accordance with an alternate embodiment of the present invention.

FIG. 5 shows a cross-sectional view that illustrates an example of a silicon controlled rectifier (SCR) structure 500 in accordance with an alternate embodiment of the present invention. SCR structure 500 is similar to SCR structure 100 and, as a result, utilizes the same reference numerals to designate the structures which are common to both structures.

As shown in FIG. 5, SCR structure 500 differs from SCR structure 100 in that structure 500 has an n-type buried layer 510 formed in substrate 110 that has a center region 510A, and an outer region 510B that adjoins center region 510A. Center region 510A has the second dopant concentration, while outer region 510B has the third dopant concentration.

In addition, SCR structure 500 has an n-type sinker down region 512 formed in the top surface of epitaxial layer 112 that has a center region 512A, and an outer region 512B that adjoins center region 512A. Center region 512A has the second dopant concentration, while outer region 512B has the third dopant concentration.

Figure 6:
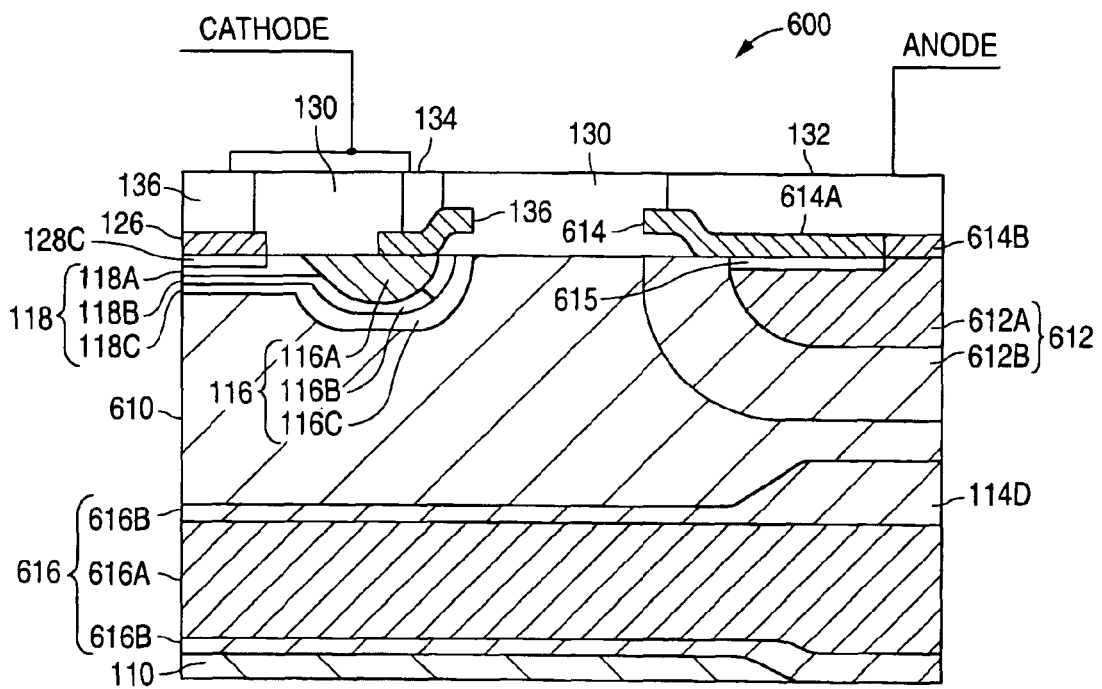
FIG. 6 is a cross-sectional view illustrating an example of a silicon controlled rectifier (SCR) structure 600 in accordance with an alternate embodiment of the present invention.

FIG. 6 shows a cross-sectional view that illustrates an example of a silicon controlled rectifier (SCR) structure 600 in accordance with an alternate embodiment of the present invention. SCR structure 600 is similar to SCR structure 100 and, as a result, utilizes the same reference numerals to designate the structures which are common to both structures.

As shown in FIG. 6, SCR structure 600 differs from SCR structure 100 in that structure 600 has an n-type epitaxial layer 610 that has the third dopant concentration, and an n-type sinker down region 612 formed in the top surface of epitaxial layer 610 that has a center region 612A, and an outer region 612B that adjoins center region 612A. Center region 612A has the first dopant concentration, while outer region 612B has the second dopant concentration.

In addition, SCR structure 600 includes a polysilicon region 614 that is formed on epitaxial layer 610 over sinker down region 612. Polysilicon region 614 includes a p+ region 614A and an n+ region 614B that are formed over sinker down region 612A. SCR structure 600 also includes a p+ region 615 that is formed in the top surface of sinker down region 612A. P+ region 615 can be formed when dopants from region 614A diffuse into center region 612A.

Further, SCR structure 600 includes an n-type buried layer 616 formed in substrate 110 that has a center region 616A, and an outer region 616B that adjoins center region 616A. Center region 616A has the first dopant concentration, while outer region 616B has the second dopant concentration.

Figure 7:
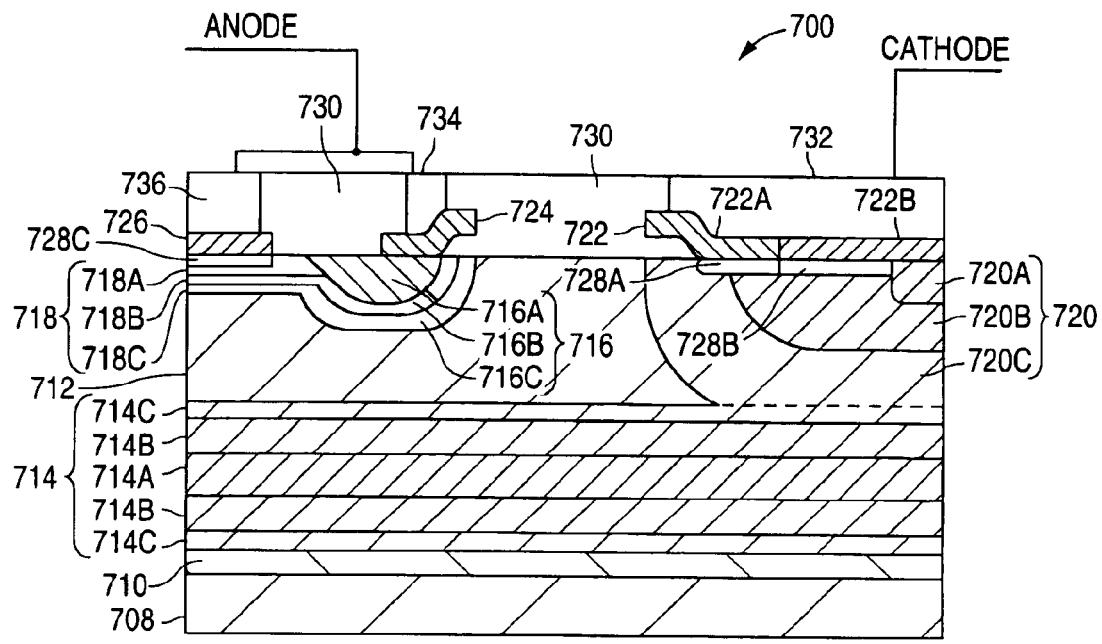
FIG. 7 is a cross-sectional view illustrating an example of a silicon controlled rectifier (SCR) structure 700 with opposite conductivity types in accordance with the present invention.

In addition to SCR structures 100, 500, and 600, the present invention includes SCR structures that utilize the opposite conductivity types. FIG. 7 shows a cross-sectional view that illustrates an example of a silicon controlled rectifier (SCR) structure 700 with opposite conductivity types in accordance with the present invention.

As shown in FIG. 7, SCR structure 700 includes a p-type substrate 708, an n-type epitaxial layer 710 that is formed on substrate 708, and a p-type well 712 that is formed in epitaxial layer 710. In addition, SCR structure 700 can include a p-type buried layer 714 that is formed in well 712. Buried layer 714 includes a center region 714A, a first outer region 714B that adjoins center region 714A, and a second outer region 714C that adjoins first outer region 714B.

Center region 714A has the fifth dopant concentration, while first outer region 714B has the sixth dopant concentration. Second outer region 714C has the seventh dopant concentration, while well 712 has the eighth dopant concentration. The first and second outer regions 714B and 714C represent the diffusion tails of center region 714A.

SCR structure 100 additionally includes an n-type region 716 that is formed in the top surface of well 712. N-type region 716 has a center region 716A, a first outer region 716B that adjoins center region 716A, and a second outer region 716C that adjoins first outer region 716B.

Center region 716A has the first dopant concentration, while first outer region 716B has the second dopant concentration. Second outer region 716C has the third dopant concentration, while epitaxial layer 710 has the fourth dopant concentration. The first and second outer regions 716B and 716C represent the diffusion tails of center region 716A.

In addition, SCR structure 100 includes an n-type region 718 that is formed in the top surface of well 712. N-type region 718 has a center region 718A, a first outer region 718B that adjoins center region 718A, and a second outer region 718C that adjoins first outer region 718B.

Center region 718A has the first dopant concentration, while first outer region 718B has the second dopant concentration and second outer region 718C has the third dopant concentration. The first and second outer regions 718B and 718C represent the diffusion tails of center region 718A. Region 718 is formed to be shallower than region 716.

SCR structure 700 further includes a p-type sinker down region 720 that is formed in the top surface of well 712. Sinker down region 720, which is spaced apart from n-type region 716, includes a center region 720A, a first outer region 720B that adjoins center region 720A, and a second outer region 720C that adjoins first outer region 720B. Center region 720A has the fifth dopant concentration, while first outer region 720B has the sixth dopant concentration, and second outer region 720C has the seventh dopant concentration. Outer regions 720B and 720C represent the diffusion tails of center region 720A.

As further shown in FIG. 7, SCR structure 700 includes a polysilicon region 722 that is formed on well 712 over sinker down region 720. Polysilicon region 722 includes an n+ region 722A that is formed over sinker down regions 720B and 720C, and a p+ region 722B that is formed over sinker down region 720A.

SCR structure 700 also includes an n+ polysilicon region 724 that is formed on well 712 over n-type region 716A. SCR structure 700 further includes a p+ polysilicon region 726 that is formed on well 712 over n-type region 718. Polysilicon regions 722, 724, and 726 are spaced apart from each other (and can include a very thin oxide layer that contacts the epi layer which is unavoidably introduced by some fabrication processes).

In addition, SCR structure 700 includes an n+ region 728A and a p+ region 728B that are formed in the top surface of sinker down region 720, and a p+ region 728C that is formed in the top surface of region 118. Regions 728A and 728B can be formed when dopants from regions 722A and 722B, respectively, diffuse out into sinker down region 720, and region 728C can be formed when dopants from region 726 diffuse out into region 118.

SCR structure 700 additionally includes a layer of isolation material 730 that is formed over well 712, and a first contact structure 732 that is formed through isolation layer 730 to make an electrical connection with polysilicon region 722. First contact structure 732, polysilicon region 722, p-type sinker down region 720, and p-type well 712 can function as the cathode of an ESD diode structure.

Further, SCR structure 700 includes a second contact structure 734 that is formed through isolation layer 730 to make an electrical connection with polysilicon region 724, and a third contact structure 736 that is formed through isolation layer 730 to make an electrical connection with polysilicon region 726. Second contact structure 734 and third contact structure 736 can be electrically connected together to function, along with polysilicon regions 724 and 726 and n-type regions 716 and 718 as the anode of the ESD diode structure.

SCR structure 700 forms a PNP bipolar transistor that utilizes p+ polysilicon region 726 and p+ region 728C as the emitter, n-type regions 716 and 718 as the base, and well 712, buried layer 714, and sinker down region 720 as the collector. SCR structure 700 also forms a NPN transistor that utilizes n+ regions 722A and 728A as the emitter, well 712, buried layer 714, and sinker down region 720 as the base, and n-type regions 716 and 718 as the collector. Thus, SCR structure 700 is substantially the same as SCR structure 100 except that the conductivity types are reversed, and the p-well 712 and p-buried layer 714 are formed in epitaxial layer 710.

Figure 8:
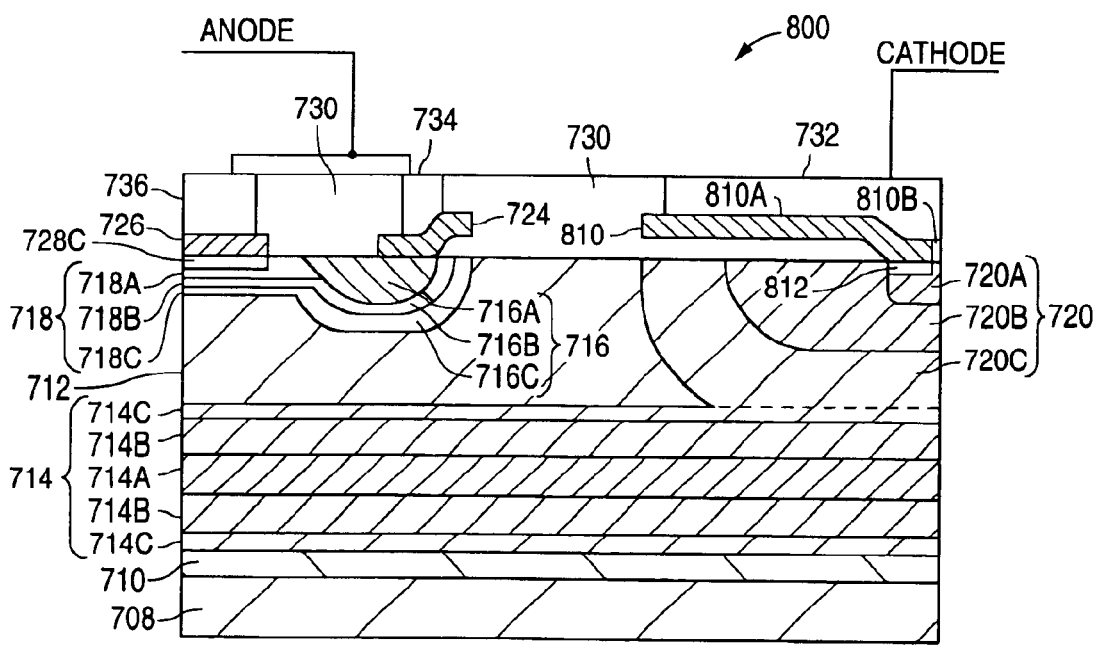
FIG. 8 is a cross-sectional view illustrating an example of a silicon controlled rectifier (SCR) structure 800 in accordance with an alternate embodiment of the present invention.

FIG. 8 shows a cross-sectional view that illustrates an example of a silicon controlled rectifier (SCR) structure 800 in accordance with an alternate embodiment of the present invention. SCR structure 800 is similar to SCR structure 700 and, as a result, utilizes the same reference numerals to designate the structures which are common to both structures.

As shown in FIG. 8, SCR structure 800 differs from SCR structure 700 in that structure 800 has a polysilicon region 810 that is formed on well 712 over sinker down region 720. Polysilicon region 810 includes an n+ region 810A and a p+ region 810B that are both formed over center region 720A of sinker down region 720. SCR structure 800 also includes an n+ region 812 that is formed in the top surface of sinker down region 720A. N+ region 812 can be formed when dopants from region 810A diffuse into center region 720A.

Figure 9:
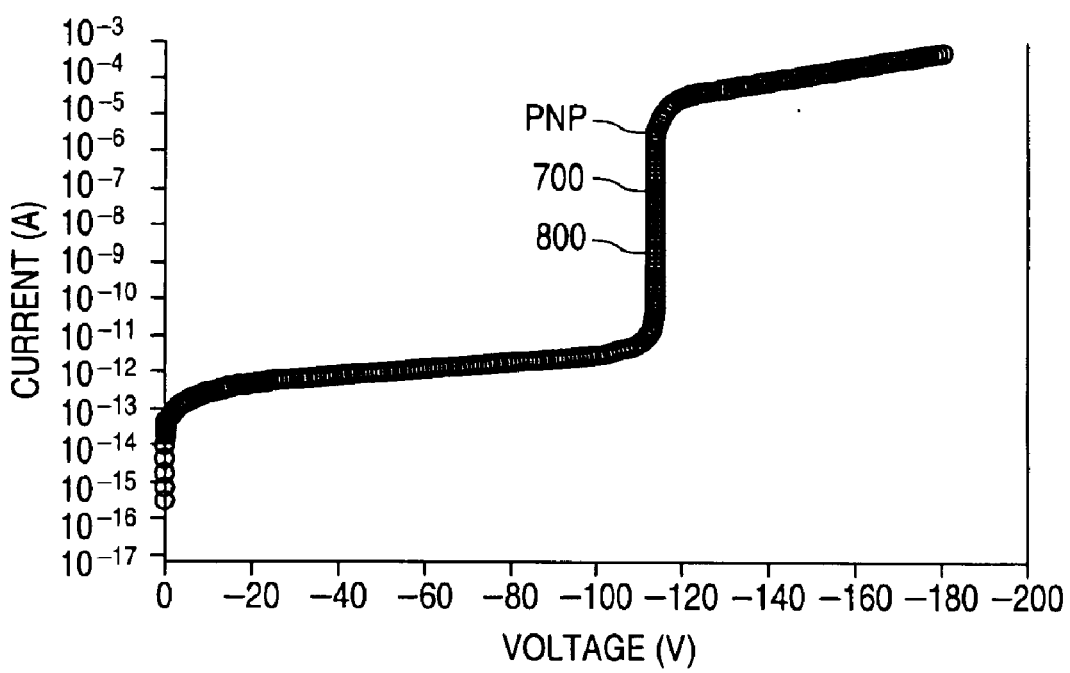
FIG. 9 is a graph illustrating a comparison between the operation of SCR structures 700 and 800 and a reference PNP transistor in accordance with the present invention.

FIG. 9 shows a graph that illustrates a comparison between the operation of SCR structures 700 and 800 and a reference PNP transistor in accordance with the present invention. The reference PNP transistor is similar to SCR structure 700, except that polysilicon layer 722 is free of n+ region 722A and sinker down region 720 is free of n+ region 728A. As shown in FIG. 9, SCR structures 700 and 800 and the PNP transistor operate substantially the same.

Figure 10:
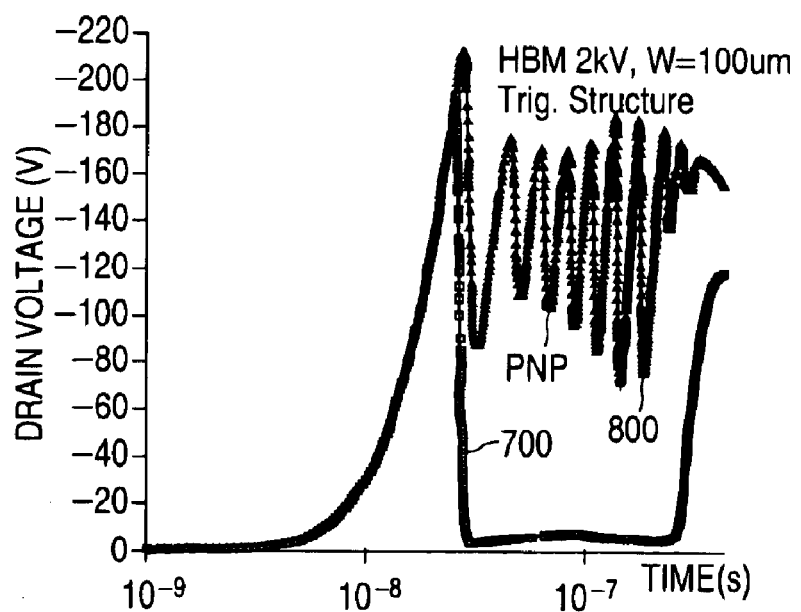
FIG. 10 is a graph further illustrating a comparison between the operation of SCR structures 700 and 800 and the reference PNP transistor in accordance with the present invention.

FIG. 10 shows a graph that further illustrates a comparison between the operation of SCR structures 700 and 800 and the reference PNP transistor in accordance with the present invention. As shown in FIG. 10, where the drain voltage is shown over time following an ESD event, the reference PNP transistor and SCR structure 800 have substantially the same drain voltage following the onset of the ESD event. SCR structure 700 and the reference PNP transistor begin the same, with the SCR structure 700 having a higher drain voltage for a period of time.

Figure 11:
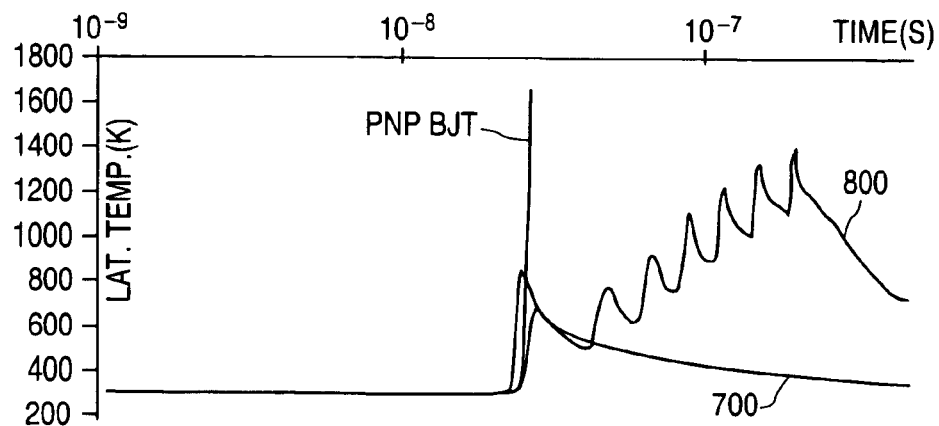
FIG. 11 is a graph additionally illustrating a comparison between the operation of SCR structures 700 and 800 and the reference PNP transistor in accordance with the present invention.

FIG. 11 shows a graph that additionally illustrates a comparison between the operation of SCR structures 700 and 800 and the reference PNP transistor in accordance with the present invention. As shown in FIG. 11, where the lattice temperature is shown over time following an ESD event, SCR structures 700 and 800 both have lower lattice temperatures than the reference PNP transistor following the onset of the ESD event.

Figure 12A:
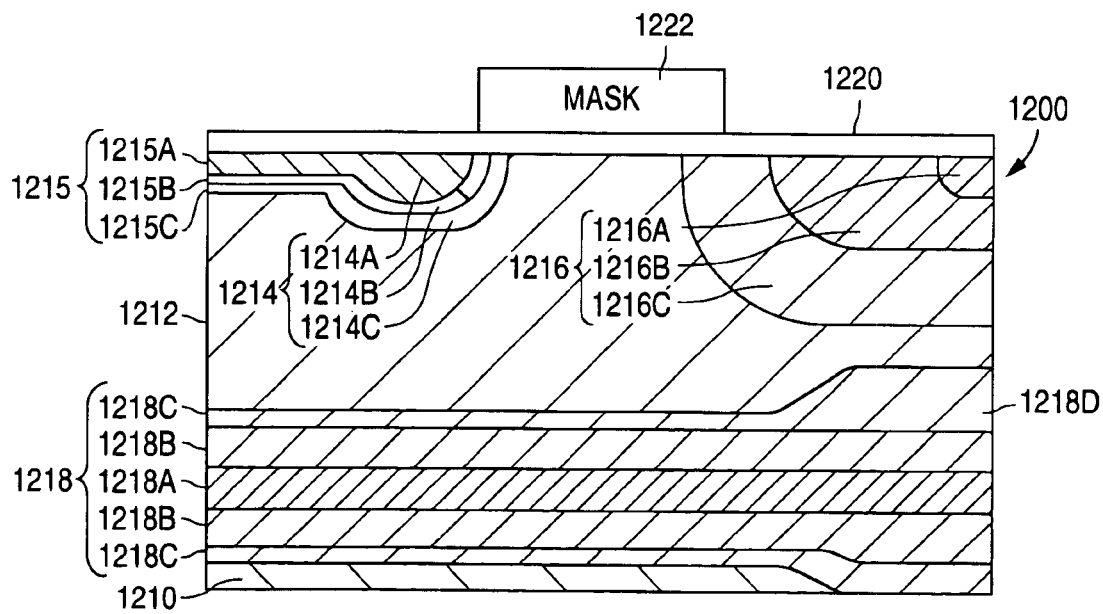
FIGS. 12A–12E are a series of cross-sectional diagrams illustrating an example of a method of forming a silicon controlled rectifier in accordance with the present invention.

FIGS. 12A–12E shows a series of cross-sectional diagrams that illustrate an example of a method of forming a silicon controlled rectifier in accordance with the present invention. As shown in FIG. 12A, the method utilizes a wafer 1200 that has been conventionally formed to have a p-type substrate 1210, and an n-type epitaxial layer 1212 that is formed on substrate 1210.

In addition, wafer 1200 includes a p-type region 1214 that is formed in epitaxial layer 1212. P-type region 1214 has a center region 1214A, a first outer region 1214B that adjoins center region 1214A, and a second outer region 1214C that adjoins first outer region 1214B.

Center region 1214A has the fifth dopant concentration, while first outer region 1214B has the sixth dopant concentration. In addition, second outer region 1214C has the seventh dopant concentration, while substrate 1210 has the eighth dopant concentration. The first and second outer regions 1214B and 1214C represent the diffusion tails of center region 1214A.

Wafer 1200 also includes a p-type region 1215 that is formed in epitaxial layer 1212. P-type region 1215 has a center region 1215A that contacts center region 1214A, a first outer region 1215B that adjoins center region 1215A and first outer region 1214B, and a second outer region 1215C that adjoins first outer region 1215B and second outer region 1214C.

Center region 1215A has the fifth dopant concentration, while first outer region 1215B has the sixth dopant concentration and second outer region 1215C has the seventh dopant concentration. The first and second outer regions 1215B and 1215C represent the diffusion tails of center region 1215A. Region 1215 is shallower that region 1214.

Wafer 1200 further includes an n-type sinker down region 1216 that is formed in the top surface of epitaxial layer 1212. Sinker down region 1216, which is spaced apart from p-type region 1214, includes a center region 1216A, a first outer region 1216B that adjoins center region 1216A, and a second outer region 1216C that adjoins first outer region 1216B. Center region 1216A has the first dopant concentration, while first outer region 1216B has the second dopant concentration. Second outer region 1216C has the third dopant concentration, while epitaxial layer 1212 has the fourth dopant concentration. Outer regions 1216B and 1216C represent the diffusion tails of center region 1216A.

Wafer 1200 can also include an n-type buried layer 1218 that is formed in the surface of p-type substrate 1210. Buried layer 1218 includes a center region 1218A, a first outer region 1218B that adjoins center region 1218A, and a second outer region 1218C that adjoins first outer region 1218B. In addition, second outer region 1218C can include a sinker up region 1218D that extends towards the top surface of epitaxial layer 1212 below sinker down region 1216.

Center region 1218A has the first dopant concentration, while first outer region 1218B has the second dopant concentration and second outer region 1218C has the third dopant concentration. The first and second outer regions 1218B and 1218C represent the diffusion tails of center region 1218A.

As shown in FIG. 12A, the method begins by forming a layer of oxide 1220 on the top surface of epitaxial layer 1212, followed by the formation and patterning of an oxide mask 1222. The exposed areas of oxide layer 1220 are then etched until the top surface of epitaxial layer 1212 is exposed over p-type regions 1214 and 1215 and n-type sinker down region 1216. Oxide mask 1222 is then removed.

Figure 12B:
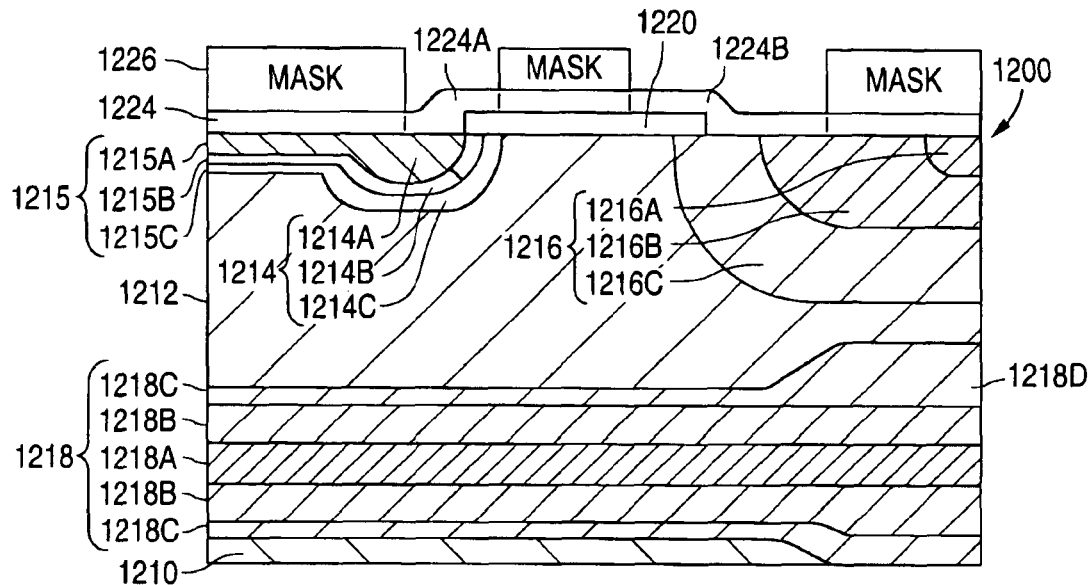

Next, as shown in FIG. 12B, a layer of polysilicon 1224 is formed on epitaxial layer 1212 and oxide layer 1220, followed by the formation and patterning of a p-type implant mask 1226 on polysilicon layer 1224. After this, the regions of polysilicon layer 1224 that are exposed by mask 1226 are implanted to form p+ polysilicon regions 1224A and 1224B. Mask 1226 is then removed.

Figure 12C:
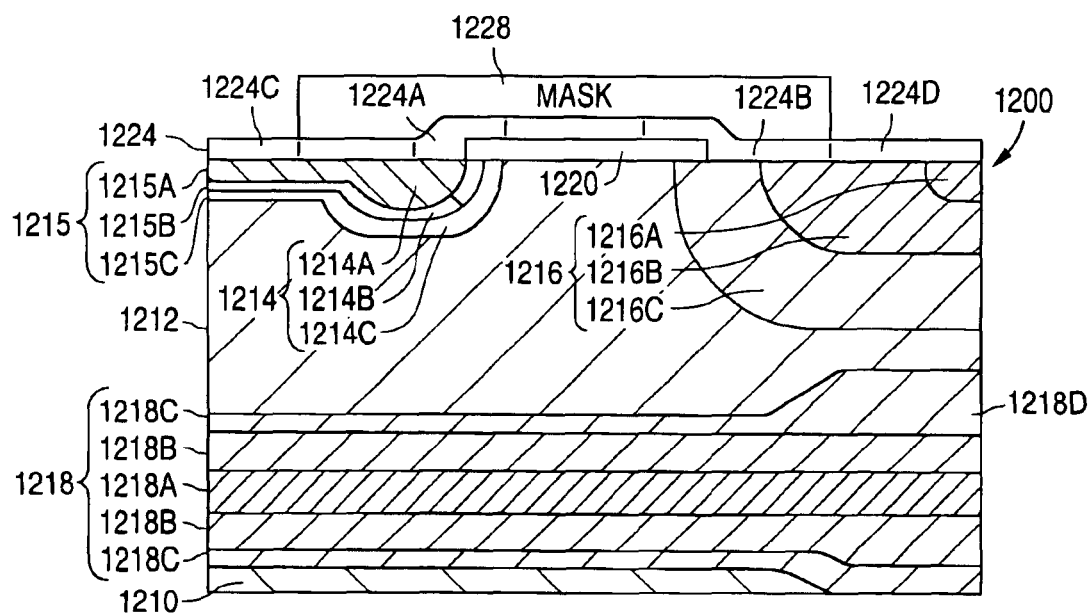

As shown in FIG. 12C, after mask 1226 has been removed, an n-type implant mask 1228 is formed and patterned on polysilicon layer 1224. After this, the regions of polysilicon layer 1224 that are exposed by mask 1228 are implanted to form n+ polysilicon regions 1224C and 1224D. Mask 1228 is then removed.

Figure 12D:
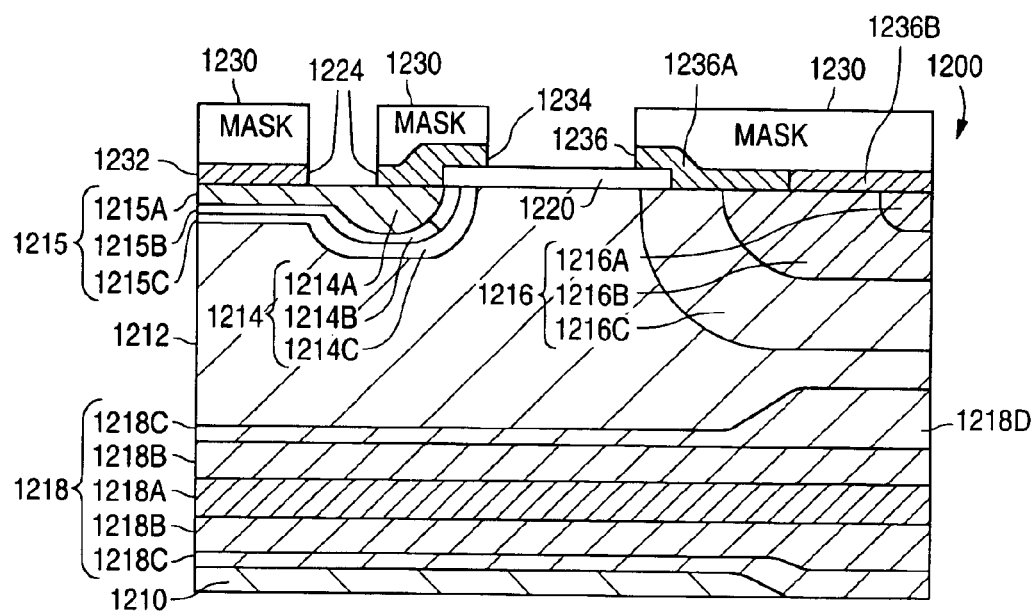

Following this, as shown in FIG. 12D, a poly mask 1230 is formed and patterned on polysilicon layer 1224. The regions of polysilicon layer 1224 that are exposed by mask 1230 are then etched to form a poly region 1232 that includes n+ region 1224C, such as poly region 126, a poly region 1234 that includes p+ region 1224A, such as poly region 124, and a poly region 1236, such as poly region 122. Poly region 1236 includes a p+ region 1236A that includes p+ region 1224B, and a n+ poly region 1236B that includes n+ region 1224D. Mask 1230 is then removed.

Figure 12E:
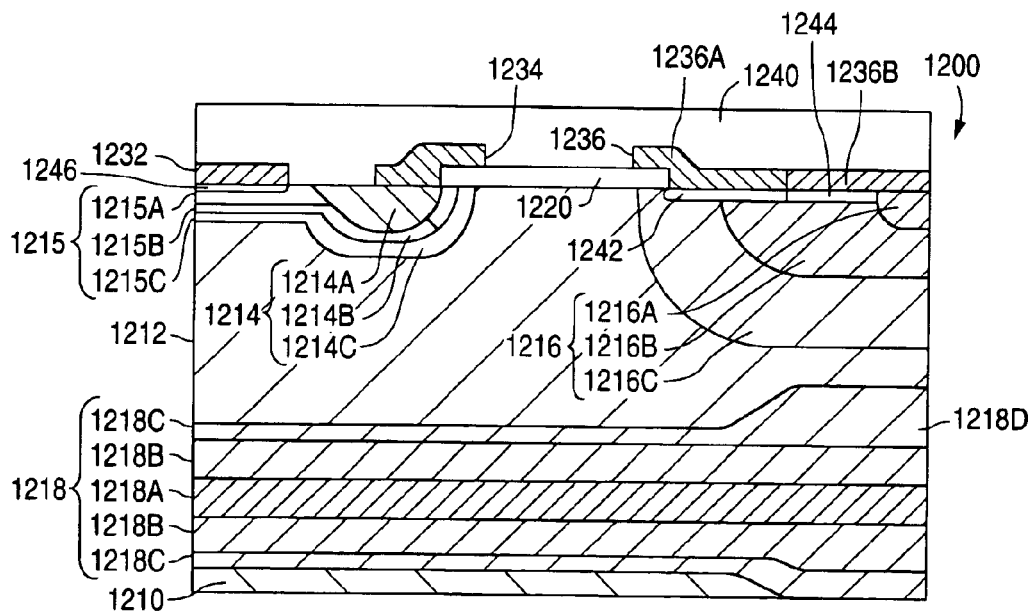

Once mask 1230 has been removed, as shown in FIG. 12E a layer of oxide 1240 is formed over epitaxial layer 1212, oxide layer 1220, and poly regions 1232, 1234, and 1236. In addition, the thermal levels associated with the formation of oxide layer 1240 (along with subsequent thermal cycles) cause dopants from poly regions 1236A and 1236B to diffuse out and form a p+ region 1242 and an n+ region 1244, respectively, in the top surface of sinker down region 1216, and dopants from poly region 1232 to diffuse out and form an n+ region 1246 in the top surface of region 1215. Following this, the process continues with the conventional steps of forming contacts through isolation layer 1240 to make electrical connections with poly regions 1232, 1234, and 1236.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A silicon controlled rectifier comprising:
   a substrate;
   an epitaxial layer of a first conductivity type formed on the substrate, the epitaxial layer having a top surface and a dopant concentration;
   a first semiconductor region of a second conductivity type formed in the epitaxial layer, the first semiconductor region contacting the top surface of the epitaxial layer;
   a second semiconductor region of the first conductivity type formed in the epitaxial layer, the second semiconductor region contacting the top surface of the epitaxial layer, being spaced apart from the first semiconductor region, and having a dopant concentration greater than the dopant concentration of the epitaxial layer;
   a first polysilicon region that contacts the top surface of the epitaxial layer over the first semiconductor region, the first polysilicon region having the second conductivity type; and
   a second polysilicon region that contacts the top surface of the epitaxial layer over the second semiconductor region, the second polysilicon region being spaced apart from the first polysilicon region and having a region of the second conductivity type.

2. The rectifier of claim 1 and further comprising a third semiconductor region formed in the second semiconductor region, the third semiconductor region having the second conductivity type.

3. The rectifier of claim 2 and further comprising a third polysilicon region that contacts the top surface of the epitaxial layer over the first semiconductor region, the third polysilicon region having the first conductivity type and being spaced apart from the first and second polysilicon regions.

4. The rectifier of claim 3 wherein the first and third polysilicon regions are electrically connected together.

5. The rectifier of claim 2 wherein the second semiconductor region has a high dopant concentration region and a low dopant concentration region that contacts the high dopant concentration region.

6. The rectifier of claim 5 wherein the second polysilicon region contacts the low dopant concentration region.

7. The rectifier of claim 5 and further comprising a pn junction that lies between the low dopant concentration region and the second polysilicon region.

8. The rectifier of claim 5 wherein a portion of the second polysilicon region is spaced apart from the epitaxial layer.

9. The rectifier of claim 5 wherein the third layer of polysilicon has a dopant concentration that is greater than a dopant concentration of the high dopant concentration region.

10. The rectifier of claim 5 wherein the third layer of polysilicon has a dopant concentration that is substantially equal to a dopant concentration of the high dopant concentration region.

11. The rectifier of claim 5 and further comprising:
    a layer of isolation material formed over the epitaxial layer;
    a first contact formed through the layer of isolation material to make an electrical connection with the first polysilicon region;
    a second contact formed through the layer of isolation material to make an electrical connection with the second polysilicon region; and
    a third contact formed through the layer of isolation material to make an electrical connection with the third polysilicon region.

12. The rectifier of claim 2 and further comprising a buried region of the first conductivity type, the buried region contacting the epitaxial layer.

13. A silicon controlled rectifier formed in a semiconductor material, the semiconductor material having a top surface, the silicon controller rectifier comprising:
   a first region of the semiconductor material, the first region having a first dopant concentration, contacting the top surface, and having a first conductivity type;
   a second region of the semiconductor material, the second region contacting the top surface and the first region, and having a second conductivity type; and
   a third region of the semiconductor material, the third region having the first conductivity type, being spaced apart from the second region, and having a plurality of areas, the plurality of areas including a first area and a second area, the first area contacting the top surface and the first region, and having a second dopant concentration greater than the first dopant concentration, the second area contacting the first area, being spaced apart from the first and second regions, and having a third dopant concentration greater than the second dopant concentration of the first area.

14. The silicon controlled rectifier of claim 13 and further comprising a fourth region of the semiconductor material, the fourth region having the second conductivity type, contacting the top surface, the first area, and the second area, and being spaced apart from the first region.

15. The silicon controlled rectifier of claim 14 and further comprising a fifth region of the semiconductor material, the fifth region contacting the top surface and the second region, having the first conductivity type, being spaced apart from the first region, and having a dopant concentration greater than the first dopant concentration.

16. The silicon controlled rectifier of claim 15 and further comprising:
   a first polysilicon region that contacts the top surface over the second region, the first polysilicon region having the second conductivity type; and
   a second polysilicon region that contacts the top surface over the third region, the second polysilicon region being spaced apart from the first polysilicon region and having a region of the second conductivity type.

17. The silicon controlled rectifier of claim 16 wherein the second polysilicon region contacts the fourth region.

18. The silicon controlled rectifier of claim 17 and further comprising a third polysilicon region that contacts the top surface over the fifth region, the third polysilicon region being electrically connected to the first polysilicon region, having the first conductivity type, being spaced apart from the first and second polysilicon regions.

19. The silicon controlled rectifier of claim 14 wherein the third region has a third area that has a fourth dopant concentration greater than the third dopant concentration of the second area, the third area contacting the second area and being spaced apart from the first area.

20. The silicon controlled rectifier of claim 13 and further comprising:
   a first polysilicon region that contacts the top surface over the second region, the first polysilicon region having the second conductivity type; and
   a second polysilicon region that contacts the top surface over the third region, the second polysilicon region being spaced apart from the first polysilicon region and having a region of the second conductivity type.

* * * * *

UNITED STATES PATENT AND TRADEMARK OFFICE
CERTIFICATE OF CORRECTION

PATENT NO. : 6,919,588 B1  
DATED : July 19, 2005  
INVENTOR(S) : Vashchenko et al.

It is certified that error appears in the above-identified patent and that said Letters Patent is hereby corrected as shown below:

Column 3,
Line 15, delete "1288" and replace with -- 128B --.

Column 4,
Line 1, delete "additions" and replace with -- addition, --.

Signed and Sealed this

Sixth Day of September, 2005

JON W. DUDAS
*Director of the United States Patent and Trademark Office*